Figure 1:
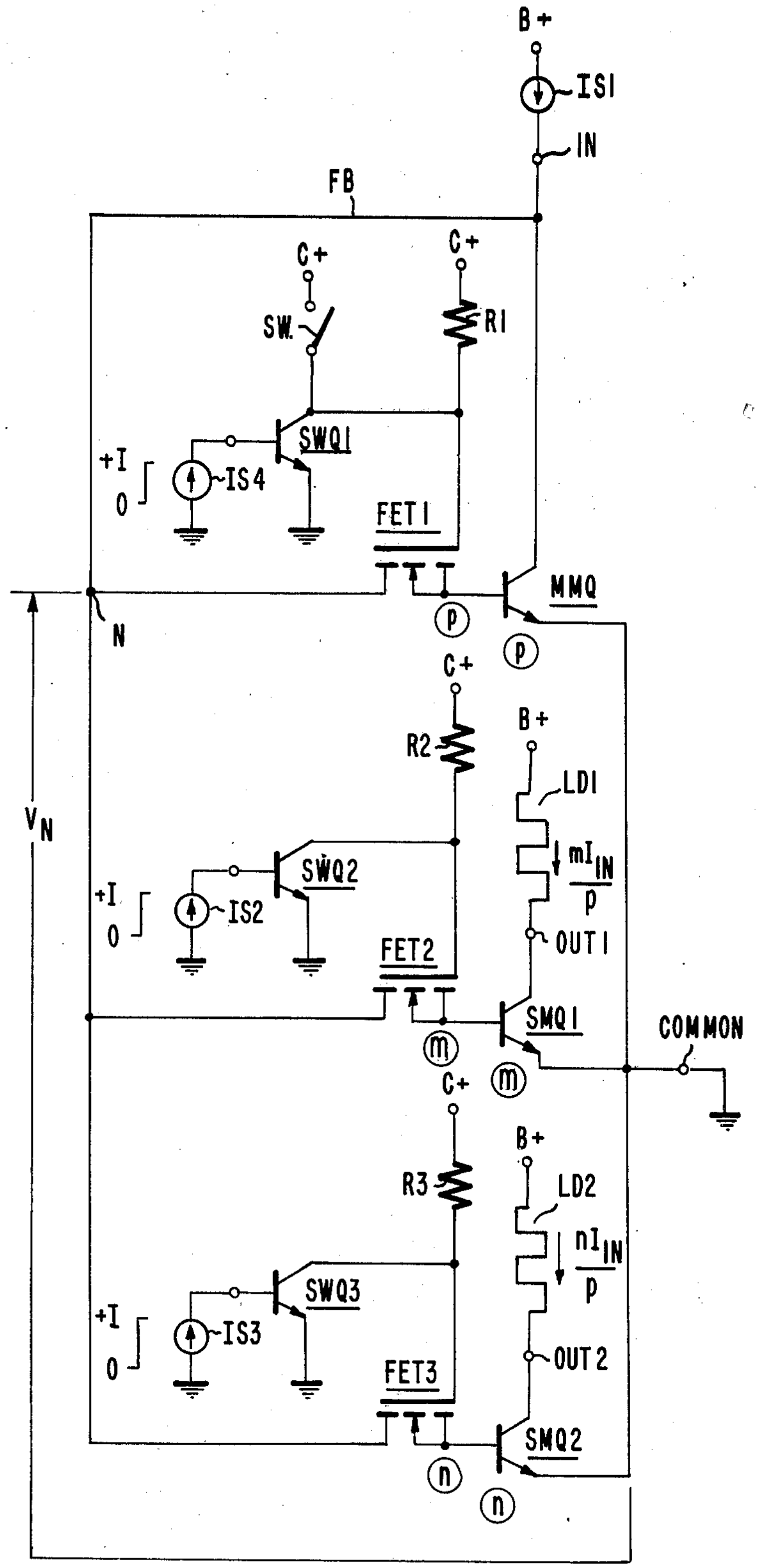

United States Patent [19]

Schade, Jr.

[11] 4,117,416

[45] Sep. 26, 1978

[54] CURRENT MIRROR AMPLIFIERS WITH PROGRAMMABLE CURRENT GAINS

[75] Inventor: Otto Heinrich Schade, Jr., North Caldwell, N.J.

[73] Assignee: RCA Corporation, New York, N.Y.

[21] Appl. No.: 855,088

[22] Filed: Nov. 28, 1977

[51] Int. Cl.[2] .......................... H03G 3/30; H03F 3/04

[52] U.S. Cl. .................................... 330/282; 330/288; 330/300

[58] Field of Search ............... 330/278, 282, 288, 295, 330/300; 307/297, 304; 323/4

[56] References Cited

U.S. PATENT DOCUMENTS 3,973,215 8/1976 Ahmed .......................... 330/288 X

*Primary Examiner*—James B. Mullins

*Attorney, Agent, or Firm*—H. Christoffersen; A. L. Limberg

[57] ABSTRACT

A current mirror amplifier (CMA) has master and slave mirroring transistors of bipolar type, input and output terminals to which the collector electrodes of the master and slave mirroring transistors respectively connect, and a common terminal to which the emitter electrodes of the mirroring transistors connect. The master mirroring transistor is provided with collector-to-base feedback for applying base potential to it which conditions its collector-to-emitter path to conduct input current applied between the common and input terminals of the CMA. The current gain of the CMA as between its input and output terminals is determined by the ratio of the transconductance of the slave mirroring transistor to that of the master mirroring transistor, whenever the base potential of the master mirroring transistor is applied to the base electrode of the slave mirroring via a transmission gate rendered transmissive responsive to a first level control potential being applied thereto. In furtherance of matching the base potentials of the master and slave mirroring transistors, so this relationship obtains, a second transmission gate is included in the collector-to-base feedback connection of the master mirroring transistor and is rendered transmissive by application of said first level of potential to it, whereby an offset potential is provided across said second transmission gate compensating for the offset potential across said first transmission gate insofar as effects on CMA current gain is concerned. Responsive to a second level of control potential applied to it the first transmission gate is rendered non-transmissive and current gain between the input and output terminals falls to zero.

10 Claims, 3 Drawing Figures

CURRENT MIRROR AMPLIFIERS WITH PROGRAMMABLE CURRENT GAINS

The present invention relates to current mirror amplifiers (CMA's) with programmable current gains.

J. M. Cartwright, Jr. in his U.S. Pat. No. 4,064,506 issued 20 Dec. 1977, entitled "Current Mirror Amplifiers with Programmable Current Gains", and assigned like the present application to RCA Corporation describes current mirror amplifiers (CMA's) using field effect transistors (FET's) of enhancement-mode type. He describes the use of a drain-to-gate connection of a "master" mirroring transistor that provides direct-coupled drain-to-gate feedback for adjusting the source-to-gate potential of that transistor to condition it for conducting as drain current an input current applied between its source and collector electrodes. He describes the application of this source-to-gate potential between the source and gate electrodes of a "slave" mirroring transistor to condition it for conducting an output current between its drain and source electrodes which is in the same ratio to the input current as the drain current versus source-to-gate potential characteristic ($I_D$-*vs.*-$V_{GS}$) of the slave mirroring transistor is to that of the master mirroring transistor.

Cartwright, Jr. obtains programmability by continually referring the source electrodes of the mirroring transistors to the same potential and selectively applying the gate potential of the master mirroring transistor to the gate of the slave mirroring transistor. The selective application is carried out by means including a further FET connected as a transmission gate between the gate electrodes of the mirroring transistors, the advantage of using the FET in the transmission gate being that the control signal for controlling transmission through the channel of that further FET is not coupled into the source-to-gate circuits of either of the mirroring transistors.

In Cartwright, Jr.'s CMA the IR drop across the channel of the further FET is negligibly small especially compared to the source-to-gate potentials of the mirroring transistors which tend to be well over a volt. The essentially zero IR drop obtains because the slave mirroring transistor being an FET has substantially zero-valued gate current. Also, a few millivolt potential offset across the channel of the further FET would have little effect on the current gain of Cartwright, Jr.'s CMA since the mirroring transistors being FET's tend to have relatively low transconductances as compared for example to a bipolar transistor.

The present inventor wishes to apply the teaching of Cartwright, Jr. to so-called BIMOS integrated circuitry, a technology in which bipolar transistors and FET's are available on the same monolithic die. For a number of reasons it is oftentimes desirable to use bipolar rather than field-effect transistors as mirroring transistors. For low voltage operation the emitter-to-base offset potentials ($V_{BE}$'s) of bipolar transistors are, with conventional fabrication, smaller than the source-to-gate potentials ($V_{GS}$'s) of FET's. For given chip area the bipolar transistors tend to exhibit better tracking of output-current-versus-input-voltage characteristics than FET's, and the transconductances of the bipolar transistors are higher for a given amount of stray capacitance so the bandwidth of the CMA's using bipolar transistors tend to be higher. Early effect is more of a problem with conventional aluminum-gate FET's than with bipolar transistors, so the current gains of CMA's using bipolar transistors are less affected by changes in the voltages across their output circuits. At the same time, it is desirable to retain an FET in the transmission gate function for securing programmability, since it affords isolation of control signal from the currents involved in the mirroring process.

The present inventor finds mere replacement of the FET's Cartwright, Jr. uses as mirroring transistors with bipolar transistors in a CMA with programmable current gain tends to result in poorly defined current gain when the FET used as a transmission gate is conductive. The reason for this is rooted in a fundamental difference between field effect and bipolar transistors: while both types of transistors are transconductance amplifiers, with their output current controllable responsive to input voltage variation, the bipolar transistor is a current amplifier also but the FET is not. To support collector current in the output circuit of the bipolar transistor, between its emitter and collector electrodes, one must supply base current to its input. The base current of the bipolar slave mirroring transistor causes an IR drop across the channel of the transmission-gate FET when it is biased into full conduction, which tends to make the base potentials of the master and slave mirroring transistors differ from each other.

Since the collector current of the slave mirroring transistor is halved with every 18 millivolts reduction of its emitter-to-base potential, even a millivolt or so of IR drop across the channel of the transmission-gate FET can cause substantial error in the current gain of the CMA. Furthermore, since the base currents of the bipolar transistors are a function of their common-emitter forward current gains, or $h_{fe}$'s, and since their $h_{fe}$'s typically range from, say, 50 to 200, the IR drop across the channel of the transmission gate will have an effect on CMA current gain that cannot be satisfactorily compensated for by the straightforward expedient of adjusting the relative $I_c$-*vs*-$V_{BE}$ characteristics of the mirroring transistors. (This adjustment is usually carried out by adjusting the relative effective areas of the emitter-base junctions of the mirroring transistors in the case of vertical-structure transistors and by adjusting the relative effective collector areas of the mirroring transistors to affect their relative collection efficiencies in the case of lateral-structure transistors.)

Bipolar master and slave transistors in a current mirror amplifier operate at the same current density versus emitter-to-base voltage and at the same temperature and are simultaneously fabricated in monolithic construction. So interestingly there is a strong statistical tendency for their $h_{fe}$'s to be substantially equal even where their $I_c$-*vs*-$V_{BE}$ characteristics differ. The availability of equal current gains in the mirroring devices makes possible the present invention.

The present invention is embodied, for example, in current mirror amplifier similar to Cartwright Jr.'s as described except for the mirroring transistors being current amplifying types and for the direct-coupled degenerative feedback connection of the master mirroring transistor being arranged to include an appropriate resistance, preferably a second transmission gate, preceding the input circuit of the master mirroring transistor in a series connection. The potential developed across this series connection by the degenerative feedback is the potential selectively applied via the first transmission gate to the input circuit of the slave mirroring transistor to achieve programmability of current gain. The second transmission gate, if used as the appropriate resistance referred to above, is arranged to be conductive at least whenever the first transmission gate is conductive and, for example, may be arranged to be continuously conductive. Since the current gains of the mirroring transistors can be made to track each other, the IR drops across the first transmission gate and the appropriate resistance can be made to track each other and compensate against differences in the potentials applied to the input circuits of the mirroring transistors that would otherwise affect the current gain of the current mirror amplifier, this being particularly simple to do where the appropriate resistance comprises a second transmission gate.

Figure 2:
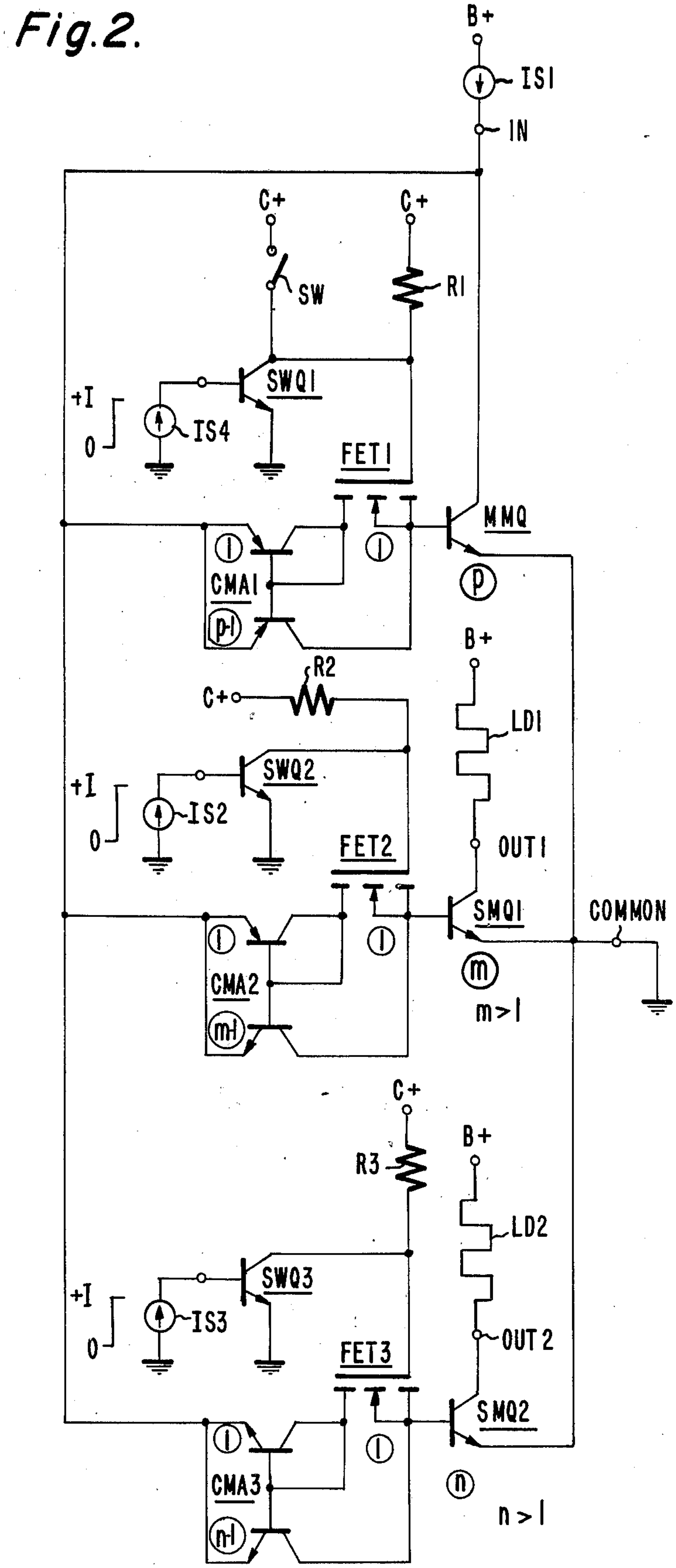
Figure 3:
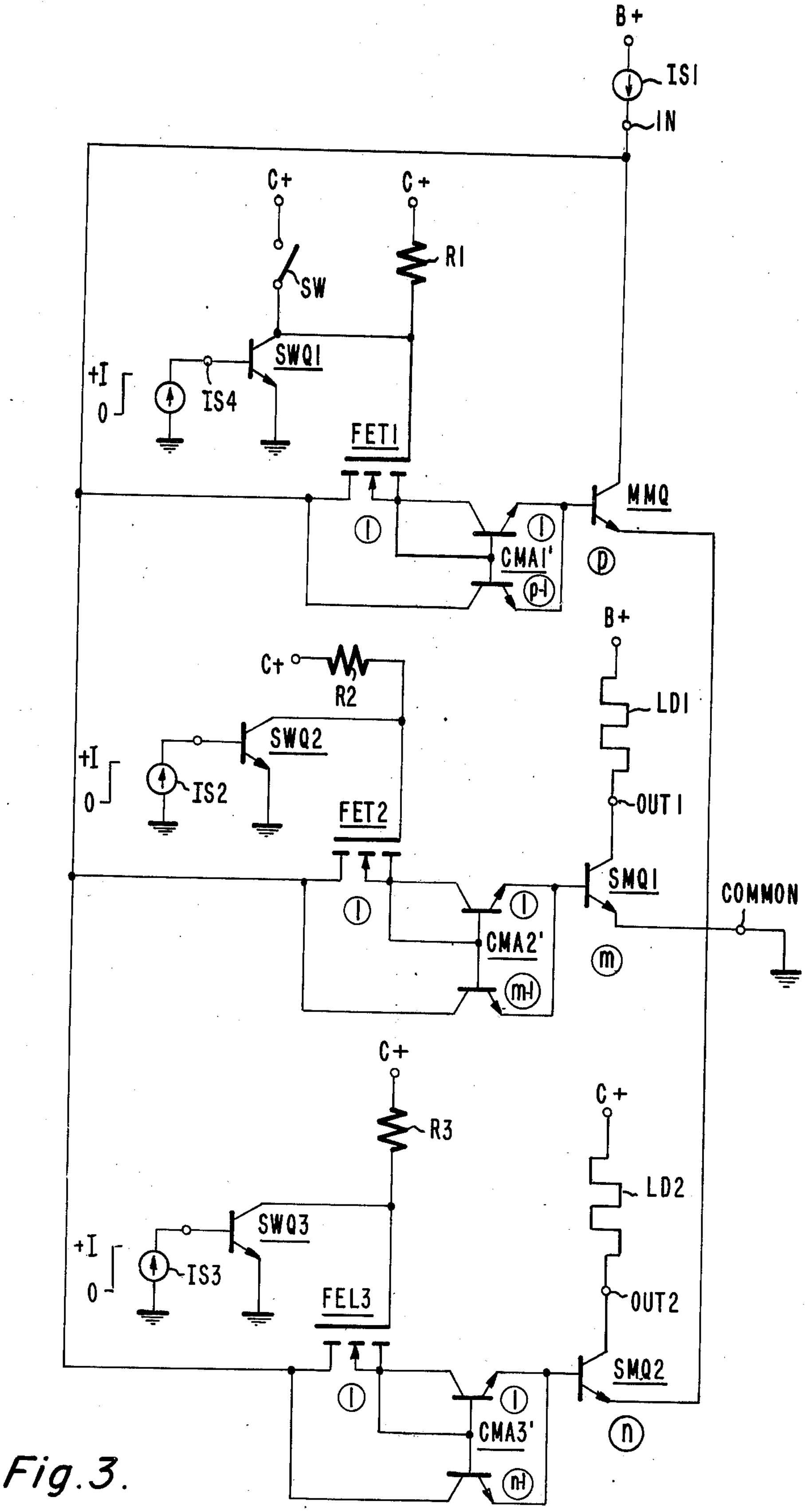

In the drawing each of the figures is a schematic diagram of a CMA with programmable current gain embodying the present invention, FIG. 1 showing simple FET's being used for the transmission gates, and each of FIGS. 2 and 3 showing alternative transmission gate configurations.

The CMA with programmable current gain shown in FIG. 1 is a dual-output CMA shown receiving input current $I_{IN}$ from a current source IS1 connected between a positive operating potential B+ and the input terminal IN of the CMA. The CMA is shown as having its common terminal COMMON connected to ground reference potential and as having a plurality of output terminals OUT1 and OUT2 connected to B+ via respective loads LD1 and LD2. MMQ is the master mirroring transistor which is to be conditioned to conduct substantially all of $I_{IN}$; and SMQ1 and SMQ2 are the first and second slave mirroring transistors arranged to demand currents from the output terminals OUT1 and OUT2, respectively. CMA's are also possible wherein there are further output terminals and associated slave mirroring transistors. Any of these CMA's as shown in FIG. 1 or described in alternative can be arranged with their output terminals connected to the slave mirroring transistors supply a shared load. This results in a single-output CMA programmable for several levels of output current, and arrangements of this sort but with the COMMON terminal connected to supply a shared load either directly or in concert with other arrangements of this sort are also feasible.

So long as field effect transistor FET1 is conductive, MMQ is provided with direct-coupled collector-to-base feedback via a direct connection FB between INPUT terminal and a node N and the channel of FET1, which feedback is used for applying a base potential to MMQ that will condition it to conduct all of $I_{IN}$ except that required to support base current flows to MMQ, SMQ1, and SMQ2. As known, one may replace the direct connection FB by an amplifier—e.g. an emitter-follower or source-follower transistor—to reduce or eliminate the diversion of input current from flowing through the collector-to-emitter path of MMQ. FET1 can be arranged to be selectively conductive as shown in FIG. 1, for example, wherein the collector load resistor R1 of switching transistor SWQ1 pulls up the gate potential of FET1 to a bias potential C+ whenever SWQ1 is nonconductive. However, FET1 can be arranged to be continually conductive by closing the switch SW to continually apply the bias potential C+ to the gate of FET1. To facilitate the following description of operation, assume for the present that this is done.

The channel of conductive FET1 will have a small IR drop across it owing to its resistace and to the base current of MMQ. The potential $V_N$ at node N respective to ground will be equal to the emitter-to-base offset potential of MMQ associated with a collector current substantially equal to $I_{IN}$, plus this IR drop. It is the IR drop across the channel of FET1 which is used to increase the potential at node N to compensate for the IR drops appearing across the transmission gates respectively comprising field effect transistors FET2 and FET3, when those transmission gates are conductive, so that slave mirroring transistors SMQ1 and SMQ2 have emitter-to-base potentials applied to them which are substantially equal to the emitter-to-base potential of master mirroring transistor MMQ.

The transmission gates provided by FET2 and FET3 will be conductive when switching transistors SWQ2 and SWQ3 are nonconductive. Then resistors R2 and R3 will pull up the gate electrode of FET2 and the gate electrode of FET3, respectively, to C+ bias potential, biasing both FET2 and FET3 into their linear resistance regions so they are conductive. The $I_c$-*vs*-$V_{BE}$ characteristics of MMQ, SMQ1, and SMQ2 are in *p:m:n* ratio as indicated by the encircled *p, m,* and *n* next to their respective emitter electrodes. With emitter-to-base potentials equal to the MMQ applied to them, SMQ1 and SMQ2 will demand collector currents $(mI_{IN})/p$ and $(nI_{IN})/p$, respectively.

The respective base currents of MMQ, SMQ1 and SMQ2 will be equal to their respective collector currents divided by their respective $h_{fe}$'s. If simultaneously fabricated and operated at the same temperature, the $h_{fe}$'s of these transistors will be substantially equal. So then the respective base currents of MMQ, SMQ1, and SMQ2 like their respective collector currents will be in *p:m:n* ratio. In order that the IR drops across FET1, FET2 and FET3 be alike it is necessary that the conductances of their channels when conductive be in *p:m:n* ratio. This is the case, as indicated by the encircled *p, m,* and *n* near their respectiveo source electrodes.

The techniques for scaling FET channel conductances are well-known. The channel widths of FET1, FET2, and FET3 may be the same and their channel lengths in *p:m:n* ratio, for example.

To halt the demand by SMQ1 for $(mI_{IN})/p$ current at OUT1 terminal, current is supplied from source IS2 to the base of grounded-emitter switching transistor SWQ2 to bias it into conduction, clamping the gate electrode of FET2 close to ground. FET2 is thus removed from conduction and the transmission gate provided by FET2 is rendered non-transmissive. So the response to $V_N$, which response appears at the base electrode of SMQ1, is severely attenuated by the high channel resistance of the non-conductive FET2 acting against the base input impedance of SMQ1. The demand by SMQ2 for $(nI_{IN})/p$ current at OUT2 terminal may analogously be halted by supplying current from source IS3 to the base electrode of switching transistor SWQ3, causing it to clamp the gate of FET3 to ground to render FET3 non-conductive and the transmission gate provided by FET3 non-transmissive.

The CMA with programmable current gain as thus far described will accept input current at all times since MMQ is continually supplied direct-coupled collector-to-base feedback. In certain applications it is desirable, when the CMA is not called upon to deliver output current, to cause the CMA not to accept applied input current. This may be done for the purpose of conserving power consumption, for example. This mode of operation may be implemented by opening switch SW, or discarding its use altogether, and arranging for a source IS4 of current to bias grounded-emitter switching transistor SWQ1 so as to clamp the gate electrode of FET1 to ground and thereby render FET1 non-conductive and the transmission gate it provides non-transmissive.

FIGS. 2 and 3 show steps one may wish to take to conserve die area in a monolithic integrated circuit construction if the ratio *p:m, p:n* or *m:n* differs substantially from unity. FET1, FET2 and FET3 may each be made as a minimum-area FET. The $I_D$-*vs*-$V_{GS}$ characteristics of FET1, FET2 and FET3 are then scaled up by factors of (*p*-1), (*m*-1) and (*n*-1) respectively by component current mirror amplifiers CMA1, CMA2 and CMA3 respectively in FIG. 2 and by current mirror amplifiers CMA1′, CMA2′ and CMA3′ respectively in FIG. 3. The scaling factors *p, m* and *n* should all be greater than or equal to unity. Preferably one or two of them are unity-valued so an output transistor of the component CMA used in obtaining the scaling factor would not be called upon to provide any collector current at all, and that output transistor would consequently be discarded in the design to leave behind only the self-biased transistor that would have been the input transistor of the component CMA. This self-biased transistor functions as a diode poled for forward conduction and may be replaced by a simple semiconductor junction, if desired.

One skilled in the art and armed with the foregoing disclosure can readily generate other embodiments of the present invention and the following claims should be liberally construed to include within their scope such embodiments as partake of the spirit of the invention. By way of example, the transmission gates may employ FET's of complementary conduction type from the bipolar mirroring transistors, rather than similar conductivity type. Or the transmission gates may employ depletion rather than enhancement-mode type FET's, with suitable changes in control voltages. By way of further example, the mirroring transistors may be provided respective emitter resistors or base-pull down circuits with conductances in similar ratio to their respective $I_c$-*vs*-$V_{BE}$ characteristics. By way of still further example, the bipolar mirroring transistors may be replaced by composite transistor structures—e.g. by Darlington cascade connections of transistors—which composite structures are substantially functional equivalents of bipolar mirroring transistors in that they are current amplifiers. The term "master and slave mirroring transistor" in claim 1 specifically is to be construed to include such composite structures.

What is claimed is:

1. A current mirror amplifier with programmable current gain comprising:

- master and slave mirroring transistors of the same conductivity type and with like current gain characteristics each having respective first and second electrodes and a respective controlled conduction path therebetween and having a respective third or control electrode, the conduction of said controlled conduction path being controlled in direct response to the potential between said second and third electrodes;
- an input terminal to which the first electrode of said master transistor is connected;
- an output terminal to which the first electrode of said slave transistor is connected;

- a common terminal to which the second electrodes of said master and slave transistors are connected;
- a node to which said input terminal is direct coupled;
- a first transmission gate for providing selective connection of said node to the third electrode of said slave mirroring transistor responsive to the selective application thereto of a first level of control signal, the current to the third electrode of said slave mirroring transistor during said selective connection developing a potential drop across the resistance of the transmissive first transmission gate; and
- means providing a resistance between said node and the third electrode of said master mirroring transistor at least whenever said selective connection is established, which resistance is of such value that the current to the third electrode of said master mirroring transistor causes a potential drop thereacross substantially equal to the potential drop across the resistance of the transmissive first transmission gate, for compensating against the effects of that potential drop on the programmable current gain.

2. A current mirror amplifier with programmable current gain as set forth in claim 1 wherein said means providing a resistance between said node and the third electrode of said master mirroring transistor comprises:

- a second transmission gate of the same general type as said first transmission gate for providing continuous connection of said node to the third electrode of said master mirroring transistor responsive to the continuous application thereto of said first level of control signal.

3. A current mirror amplifier with programmable current gain as set forth in claim 1 wherein said means providing a resistance between said node and the third electrode of said master mirroring transistor comprises:

- a second transmission gate of the same general type as said first transmission gate and providing selective connection of said node to the third electrode of said master mirroring transistor responsive to the selective application thereto of said first level of control signal, said first level of control signal being applied to said first transmission gate at least whenever said first level of control signal is applied to said second transmission gate.

4. A current mirror amplifier with programmable current gain comprising:

- input, output, and common terminals;
- first and second bipolar transistors of the same conductivity type respectively used as master and slave mirroring transistors, having respective collector electrodes respectively connected to said input terminal and to said output terminal, having respective emitter electrodes connected to said common terminal, and having respective base electrodes;
- a node to which said input terminal is direct coupled;
- first and second transmission gates having respective control electrodes and providing respective controlled resistances connecting said node to the base electrode of said second transistors and to the base electrode of said first transistor, respectively, which first and second transmission gates when both are transmissive by reason of their controlled resistances being at their lowest values tend to condition the current gain of said current mirror amplifier to be substantially equal to the transconductance of said second bipolar transistor divided by the transconductance of the first;

means applying a first control potential to the control electrode of said first transmission gate for selectively lowering the controlled resistance it provides between said node and the base electrode of said second transistor; and means applying a second control potential substantially equal to said first control potential to the control of said second transmission gate, at least whenever said first control potential is applied to the control electrode of said first transmission gate, for lowering the controlled resistance it provides between said node and the base electrode of said first transmission, to cause the potential drop across the controlled resistances of said first and second transmission gate to be substantially equal whenever said first control potential is applied to the control electrode of said first transmission gate, thereby to substantially compensate the effect of the potential drop across the controlled resistance of said first transmission gate upon the current gain of said current mirror amplifier.

5. A current mirror amplifier with programmable current gain as set forth in claim 4 wherein said first and second transmission gates respectively consist of first and second field effect transistors of similar channel type, having respective channels that provide their respective controlled resistance paths and having respective gate electrodes that serve as their respective control electrodes.

6. A current mirror amplifier with programmable current gain as set forth in claim 4 wherein said first transmission gate comprises:

a first field effect transistor having a gate electrode that serves as the control electrode of said first transmission gate and having a channel rendered conductive by application of said first control signal;

third and fourth bipolar transistors of the same conductivity type as each other, each having base and emitter and collector electrodes; and means for connecting said third and fourth bipolar transistors in a first component current mirror amplifier configuration, with an input circuit in series connection with the channel of said first field effect transistor between said node and the base electrode of said second bipolar transistor to provide a first of two parallelled components of the controlled resistance of said first transmission gate, and with an output circuit connected between said node and the base electrode of said second bipolar transistor to provide a second of said two parallelled components of the controlled resistance of said first transmission gate, the input circuit of said first component current mirror amplifier being between the collector electrode of said third bipolar transistor and an interconnection between the emitter electrodes of said third and fourth bipolar transistors, the output circuit of said first component current mirror being between that interconnection and the collector electrode of said fourth bipolar transistor, and the collector electrode of said third bipolar transistor being direct coupled to an interconnection between the base electrodes of said third and fourth bipolar transistors, — and wherein said second transmission gate comprises:

a second field effect transistor having a gate electrode that serves as a control electrode of said first transmission gate and having a channel rendered conductive by application of said second control signal;

fifth and sixth bipolar transistors of the same conductivity type as each other, each having base and emitter and collector electrodes; and means for connecting said fifth and sixth bipolar transistors in a second component current mirror amplifying configuration, with an input circuit in series connection with the channel of said second field effect transistor between said node and the base electrode of said first bipolar transistor to provide a first of two parallelled components of the controlled resistance of said second transmission gate, and with an output circuit connected between said node and the base electrode of said first bipolar transistor to provide a second of said two parallelled components of the controlled resistance of said second transmission gate, the input circuit of said second component mirror amplifier being between the collector electrode of said fifth bipolar transistor and an interconnection between the emitter electrodes of said fifth and sixth bipolar transistors, the output circuit of said second component mirror being between that interconnection of the collector electrode of said sixth bipolar transistor, and the collector electrode of said fifth bipolar transistor being direct coupled to an interconnection between the base electrodes of said fifth and sixth bipolar transistors.

7. A current mirror amplifier with programmable current gain as set forth in claim 4 wherein said first transmission gate comprises:

a first field effect transistor having a gate electrode that serves as the control electrode of said first transmission gate and having a channel rendered conductive by application of said first control signal;

third and fourth bipolar transistors of the same conductivity type as each other, each having base and emitter and collector electrodes; and means for connecting said third and fourth bipolar transistors in a first component current mirror amplifier configuration, with an input circuit in series connection with the channel of said first field effect transistor between said node and the base electrode of said second bipolar transistor to provide a first of two parallelled components of the controlled resistance of said first transmission gate, and with an output circuit connected between said node and the base electrode of said second bipolar transmission to provide a second of said two parallelled components of the controlled resistance of said first transmission gate, the input circuit of said first component current mirror amplifier being between the collector electrode of said third bipolar transistor and an interconnection between the emitter electrodes of said third and fourth bipolar transistors, the output circuit of said first component current mirror being between that interconnection and the collector electrode of said fourth bipolar transistor, and the collector electrode of said third bipolar transistor being direct coupled to an interconnection between the base electrodes of said third and fourth bipolar transistors — and wherein said second transmission gate comprises a second field effect transistor having a gate electrode that serves as the control electrode of said second transmission gate and having a channel rendered conductive by application of said second control signal, and diode means connected in series with the channel of said second field effect transistor between said node and the base electrode of said first bipolar transistor and poled for conducting the base current of said first bipolar transistor when the channel of said second field effect transistor is rendered conductive.

8. A current mirror amplifier with programmable current gain as set forth in claim 7 where said diode means comprises a fifth, self-biased bipolar transistor.

9. A current mirror amplifier with programmable current gain as set forth in claim 4 wherein said first transmission gate comprises:

a first field effect transistor that serves as a control electrode of said first transmission gate and having a channel rendered conductive by application of said first control potential channel, and diode means connected in series with the channel of said first field effect transistor between said node and the base electrode of said second bipolar transistor and poled for conducting the base current of said second bipolar transistor when the channel of said first field effect transistor is rendered conductive—and wherein said second transmission gate comprises:

a second field effect transistor having a gate electrode that serves as a control electrode of said second transmission gate and having a channel;

third and fourth bipolar transistors of the same conductivity type as each other, each having base and emitter and collector electrodes; and means for connecting said third and fourth bipolar transistors in a component current mirror amplifying configuration, with an input circuit in series connection with the channel of said second field effect transistor between said node and the base electrode of said first bipolar transistor to provide a first of two parallelled components of the controlled resistance of said second transmission gate, and with an output circuit connected between said node and the base electrode of said first bipolar transmission to provide a second of said two parallelled components of the controlled resistance of said second transmission gate, the input circuit of said component mirror amplifier being between the collector electrode of said third bipolar transistor and an interconnection between the emitter electrodes of said third and fourth bipolar transistors, the output circuit of said component mirror being between that interconnection of the collector electrode of said fourth bipolar transistor, and the collector electrode of said third bipolar transistor being direct coupled to an interconnection between the base electrodes of said third and fourth bipolar transistors.

10. A current mirror amplifier with programmable current gain as set forth in claim 9 where said diode means comprises a fifth, self-biased bipolar transistor.

* * * * *

UNITED STATES PATENT AND TRADEMARK OFFICE
CERTIFICATE OF CORRECTION

PATENT NO. : 4,117,416

DATED : September 26, 1978

INVENTOR(S) : Otto Heinrich Schade, Jr.

It is certified that error appears in the above-identified patent and that said Letters Patent is hereby corrected as shown below:

Column 3, line 39, "to" should be --so--
line 68, "resistace" should be --resistance--

Column 4, line 38, "respectiveo" should be --respective--

Column 7, line 15, "transmission" should be --transistor--
line 17, "gate" should be --gates--

Column 8, lines 53 and 54, "transmission" should be --transistor--.

Signed and Sealed this

*Twenty-fourth* Day of *April 1979*

[SEAL]

*Attest:*

DONALD W. BANNER
*Commissioner of Patents and Trademarks*

RUTH C. MASON
*Attesting Officer*